(12) United States Patent
Alpman et al.

(10) Patent No.: US 11,581,900 B2
(45) Date of Patent: Feb. 14, 2023

(54) ANALOG-TO-DIGITAL CONVERTER ERROR SHAPING CIRCUIT AND SUCCESSIVE APPROXIMATION ANALOG-TO-DIGITAL CONVERTER

(71) Applicant: Radiawave Technologies Co., Ltd., Shenzhen (CN)

(72) Inventors: Erkan Alpman, Portland, OR (US); Xiaofeng Guo, Shenzhen (CN); Jon Sweat Duster, Beaverton, OR (US); Yulin Tan, Shenzhen (CN); Ning Zhang, Shenzhen (CN); Haigang Feng, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 114 days.

(21) Appl. No.: 17/350,796

(22) Filed: Jun. 17, 2021

(65) Prior Publication Data
US 2021/0313997 A1   Oct. 7, 2021

Related U.S. Application Data

(63) Continuation of application No. PCT/CN2020/084853, filed on Apr. 15, 2020.

(30) Foreign Application Priority Data

May 13, 2019   (CN) .......................... 201910396045.8

(51) Int. Cl.
*H03M 1/10*   (2006.01)
*H03M 1/46*   (2006.01)
(Continued)

(52) U.S. Cl.
CPC .......... *H03M 1/462* (2013.01); *H03M 1/129* (2013.01); *H03M 1/466* (2013.01); *H03M 7/165* (2013.01)

(58) Field of Classification Search
CPC ........ H03M 1/462; H03M 1/466; H03M 1/38; H03M 1/468; H03M 1/1009;
(Continued)

(56) References Cited

U.S. PATENT DOCUMENTS 8,040,271 B2 * 10/2011 Furuta ................. H03M 1/0682
                                                                   341/172
9,461,665 B1 * 10/2016 Kim ...................... H03M 1/462
(Continued)

FOREIGN PATENT DOCUMENTS

CN        101807923 A      8/2010
CN        105897266 A      8/2016
(Continued)

OTHER PUBLICATIONS

First Office Action issued in counterpart Chinese Patent Application No. 201910396045.8, dated Nov. 26, 2019.
(Continued)

*Primary Examiner* — Linh V Nguyen
(74) *Attorney, Agent, or Firm* — Westbridge IP LLC

(57) ABSTRACT

Disclosed are an analog-to-digital converter error shaping circuit and a successive approximation analog-to-digital converter. The analog-to-digital converter error shaping circuit includes a decentralized capacitor array, a data weighted average module, a mismatch error shaping module, a control logic generation circuit, a digital filter and a decimator. The decentralized capacitor array includes two symmetrically arranged capacitor array units, each capacitor array unit includes a first sub-capacitor array of a high segment bit and a second sub-capacitor array of a low segment bit. The data weighted average module is configured to eliminate correlation between the first sub-capacitor array and an input (Continued)

signal, and the mismatch error shaping module is configured to eliminate correlation between the second sub-capacitor array and the input signal.

8 Claims, 3 Drawing Sheets

(51) Int. Cl.
*H03M 1/12* (2006.01)
*H03M 7/16* (2006.01)

(58) Field of Classification Search
CPC ........ H03M 1/1245; H03M 1/08; H03M 1/12; H03M 1/804; H03M 1/0854; H03M 1/68; H03M 1/403; H03M 1/80; H03M 3/322; H03M 1/004; H03M 3/37; H03M 1/0668; H03M 1/10; H03M 1/1019; H03M 1/1042; H03M 1/1047; H03M 1/1061
USPC .......................... 341/118–121, 155, 172, 150
See application file for complete search history.

(56) References Cited

U.S. PATENT DOCUMENTS

| | | | |
|---|---|---|---|
| 9,780,802 B1 | 10/2017 | Kim et al. | |
| 2013/0088375 A1* | 4/2013 | Wu | H03M 1/1047 341/120 |
| 2015/0002321 A1* | 1/2015 | Zhou | H03M 1/0617 341/118 |
| 2015/0180498 A1* | 6/2015 | Yang | H03M 1/1057 341/161 |
| 2015/0256190 A1* | 9/2015 | Takayama | H03M 1/1033 341/118 |
| 2015/0263756 A1* | 9/2015 | Chiu | H03M 1/08 341/172 |
| 2016/0079995 A1* | 3/2016 | Zare-Hoseini | H03M 1/403 341/120 |
| 2018/0183450 A1 | 6/2018 | Liu | |
| 2018/0219558 A1* | 8/2018 | Chiu | H03M 1/804 |
| 2020/0119744 A1* | 4/2020 | Lin | H03M 1/0854 |
| 2020/0228132 A1* | 7/2020 | Huang | H03M 1/468 |
| 2021/0119637 A1* | 4/2021 | Lin | H03M 1/1245 |
| 2021/0266004 A1* | 8/2021 | Guo | H03M 3/426 |

FOREIGN PATENT DOCUMENTS

| | | |
|---|---|---|
| CN | 107135000 A | 9/2017 |
| CN | 107565969 A | 1/2018 |
| CN | 107809244 A | 3/2018 |
| CN | 108649958 A | 10/2018 |
| CN | 109586722 A | 4/2019 |
| CN | 110113051 A | 8/2019 |

OTHER PUBLICATIONS

International Search Report and Written Opinion issued in corresponding PCT Application No. PCT/CN2020/084853, dated Jul. 15, 2020.
Notification to Grant Patent Right for Invention issued in counterpart Chinese Patent Application No. 201910396045.8, dated Feb. 3, 2020.

* cited by examiner

ANALOG-TO-DIGITAL CONVERTER ERROR SHAPING CIRCUIT AND SUCCESSIVE APPROXIMATION ANALOG-TO-DIGITAL CONVERTER

CROSS REFERENCE TO RELATED APPLICATIONS

This application is a Continuation Application of International Application No. PCT/CN2020/084853, filed on Apr. 15, 2020, which claims the priority to Chinese Patent Application No. 201910396045.8, entitled "Analog-to-Digital Converter Error Shaping Circuit and Successive Approximation Analog-to-Digital Converter", submitted to the China National Intellectual Property Administration on May 13, 2019. The disclosures of the aforementioned applications are hereby incorporated by reference in their entireties.

TECHNICAL FIELD

This application relates to the technical field of semiconductor integrated circuits, in particular to an analog-to-digital converter error shaping circuit and a successive approximation analog-to-digital converter.

BACKGROUND

For ultra-high precision successive approximation analog-to-digital converters (including oversampling analog-to-digital converters and noise-shaping analog-to-digital converters), linearity of the capacitor array is a major limiting factor, because the oversampling technique is only effective for reducing quantization noise, and the nonlinearity of the capacitor array will cause harmonics. These harmonic components are distributed in the signal band, and the oversampling technique cannot eliminate them.

Trace parasitic and unit capacitance mismatch are two factors that affect linearity. Ideally, the nonlinear error introduced by trace parasitic in capacitor array can be solved through perfect circuit and layout design. Unit capacitance mismatch is also a difficult problem to solve, because it is only related to process accuracy parameters and capacitance size. And, the mismatch is inversely proportional to the square root of the capacitance size. 4 times capacitance size can only increase the linearity of 6 dB at most. Take a capacitance array with a suitable circuit and layout design as shown in FIG. 1 as an example, a Most Significant Bits (MSB) capacitor array with 7 bits binary weight is provided together with a Least Significant Bits (LSB) capacitor array with 5 bits binary weight, a bridge capacitor is provided in the middle to attenuate LSB to MSB. 1 C represents unit capacitance, its total size is about 1 pF, which can provide 70 dB Digital-to-analog Converter (DAC) linearity and can meet the requirements of a 12 bits Successive Approximation Register Analog-to-digital Converter (SAR ADC) for DAC capacitor array. While for a 14 bits SAR ADC, the linearity of the capacitor array needs to be increased to 4 times, that is, 12 dB. At this time, the total size of the capacitor array needs to be at least 16 pF, although the power consumption and layout area are greatly increased, it is still within the acceptable range. However, for a 16 bits SAR ADC and for a similar design, the total capacitor size needs to reach 256 pF to meet the linearity requirements of the capacitor array, and such a size is too large for power consumption and area to accept.

SUMMARY

The main object of this application is to provide an analog-to-digital converter error shaping circuit, which aims to reduce the error of the capacitor array and improve the linearity of the DAC capacitor array without increasing the area of the capacitor array.

In order to achieve the above object, this application provides an analog-to-digital converter error shaping circuit, including a decentralized capacitor array, a data weighted average module, a mismatch error shaping module, a control logic generation circuit, a digital filter and a decimator; where:

the decentralized capacitor array includes two symmetrically arranged capacitor array units, each capacitor array unit includes a first sub-capacitor array of a high segment bit and a second sub-capacitor array of a low segment bit;

the first sub-capacitor array includes first capacitor units sequentially connected in parallel and first switches, each first capacitor unit is connected to the data weighted average module and the mismatch error shaping module through one of the first switches, and capacitance of each first capacitor unit is equal;

the second sub-capacitor array includes second capacitor units and second switches, the second capacitor units are set in sequence from low bit to high bit in a binary weighted manner by capacitance, and each second capacitor unit is connected to the mismatch error shaping module through one of the second switches;

a signal terminal of the control logic generation circuit is connected to a signal input of the data weighted average module and a signal input of the mismatch error shaping module, and the control logic generation circuit is configured to output a high-bit binary code to the data weighted average module and output a low-bit binary code to the mismatch error shaping module;

the mismatch error shaping module is configured to control over-sampling conversion of the decentralized capacitor array, and control a lower plate of each first capacitor unit and a lower plate of each second capacitor unit to reset alternately in sequence after each conversion, where reset of each first capacitor unit occurs before sampling, and reset of each second capacitor unit occurs after sampling, so that an error introduced by each second capacitor unit in last conversion is subtracted from sampled signal;

the data weighted average module is configured to convert the high-bit binary code into a thermometer code to adapt to the first sub-capacitor array, record a last first capacitor unit encoded as X participating in current conversion, and take a first capacitor unit encoded as X+1 as an initial capacitor unit to start conversion at beginning of next conversion; and the digital filter and the decimator are configured to average signal converted by the analog-to-digital converter for multiple times and output.

In an embodiment, the first sub-capacitor array is a high-bit capacitor array, and numbers of the first capacitor units and the first switches are both $2^k-1$, where k is greater than 1; the second sub-capacitor array is a low-bit capacitor array; and a capacitance of a first capacitor unit with a lowest bit is twice a maximum capacitance of the second capacitor units, and the capacitance of each first capacitor unit is 2n times a unit capacitance, where n is greater than or equal to 1.

In an embodiment, the digital filter and the decimator is configured to average the signal converted by the analog-to-digital converter more than $2^m$ times, where m is greater than or equal to 1.

In an embodiment, a sum of errors introduced in analog-to-digital conversion by the first capacitor units and the second capacitor units is zero.

This application further provides a successive approximation analog-to-digital converter including a comparator, a register connected to an output of the comparator, and the analog-to-digital converter error shaping circuit as described above.

According to the technical solution of this application, a decentralized capacitor array, a data weighted average module, a mismatch error shaping module, a control logic generation circuit, a digital filter and a decimator are used to form an analog-to-digital converter error shaping circuit. The decentralized capacitor array includes two symmetrically arranged capacitor array units, each capacitor array unit includes a first sub-capacitor array of a high segment bit and a second sub-capacitor array of a low segment bit. The first sub-capacitor array includes first capacitor units sequentially connected in parallel and first switches, each first capacitor unit is connected to the data weighted average module and the mismatch error shaping module through one of the first switches, and capacitance of each first capacitor unit is equal. The second sub-capacitor array includes second capacitor units and second switches, the second capacitor units are set in sequence from low bit to high bit in a binary weighted manner by capacitance, and each second capacitor unit is connected to the mismatch error shaping module through one of the second switches.

The data weighted average module is configured to convert the binary code output by the control logic generation circuit into a thermometer code and output it to the first sub-capacitor array, at the same time control each first capacitor unit to participate in the conversion equal or similar times, and eliminate the correlation between the first sub-capacitor array and the input signal. At the same time, the mismatch error shaping module controls the first capacitor units and the second capacitor units to reset alternately after each conversion, while the other keeps the switching state where the conversion is completed, so as to eliminate the correlation between the second sub-capacitor array and the input signal. So that the harmonic energy caused by the nonlinearity of the capacitor array is scattered to the noise floor, and the digital filter and the decimator are configured for average and output, and the harmonics are filtered out, so as to improve the signal-to-noise ratio, reduce the error of the capacitor array and improve the linearity of the DAC capacitor array without increasing the area of the capacitor array, thereby breaking the limitation of capacitor array to high precision SAR ADC.

BRIEF DESCRIPTION OF THE DRAWINGS

In order to more clearly explain the embodiments of this application or the technical solutions in the prior art, the drawings used in the description of the embodiments or the prior art will be briefly introduced below. Obviously, the drawings in the following description are merely some embodiments of this application. For those of ordinary skill in the art, other drawings can be obtained based on the structure shown in these drawings without paying creative work.

The realization of the object, functional characteristics, and advantages of this application will be further described in conjunction with the embodiments and with reference to the accompanying drawings.

DETAILED DESCRIPTION OF THE EMBODIMENTS

In the following, the technical solutions in the embodiments of this application will be clearly and completely described in connection with the drawings in the embodiments of this application. Obviously, the described embodiments are only a part of the embodiments of this application, not all of the embodiments. Based on the embodiments of this application, all other embodiments obtained by those of ordinary skill in the art without creative efforts shall fall within the claimed scope of this application.

In addition, the description of "first", "second", etc. in this application is only used for description purposes, it cannot be understood as indicating or implying its relative importance or implicitly indicating the number of technical features indicated. Therefore, a features associated with "first" and "second" may explicitly or implicitly include at least one of such feature. In addition, the "and/or" in the full text includes three scenarios. Take "A/B" as an example, it includes A technical solution, B technical solution, and technical solutions that A and B are both met. In addition, the technical solutions of the various embodiments can be combined with each other, but they must be based on the ability of those skilled in the art to realize. When the combination of technical solutions conflicts with each other or cannot be realized, it should be considered that the combination of such technical solutions does not exist, or is not within the claimed scope of this application.

This application provides an analog-to-digital converter error shaping circuit.

Figure 1:
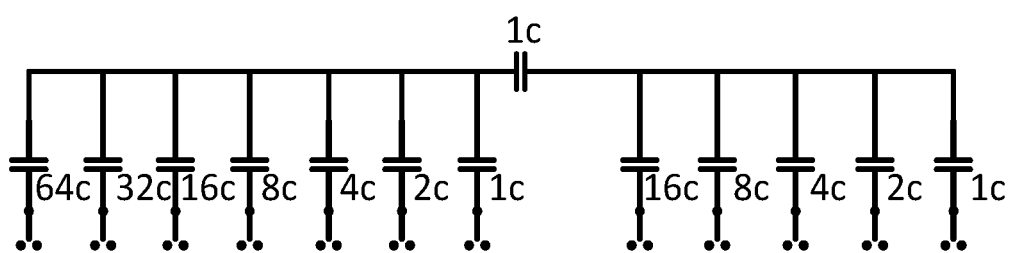
FIG. 1 is a schematic structural diagram of a conventional capacitor array.
Figure 2:
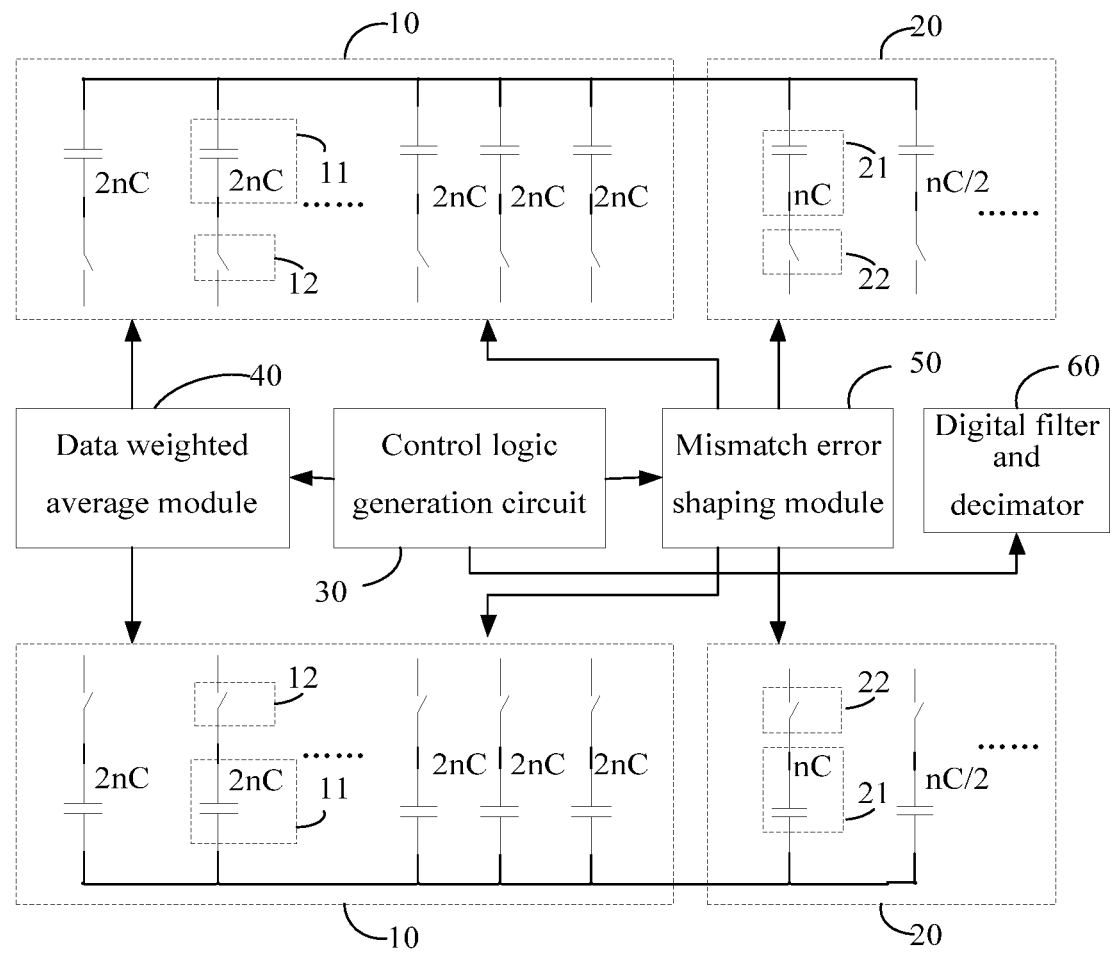
FIG. 2 is a schematic module diagram of an analog-to-digital converter error shaping circuit according to an embodiment of this application.

As shown in FIG. 2, FIG. 2 is a schematic module diagram of an analog-to-digital converter error shaping circuit according to an embodiment of this application. This application provides an analog-to-digital converter error shaping circuit including a decentralized capacitor array, a data weighted average module 40, a mismatch error shaping module 50, a control logic generation circuit 30, a digital filter and a decimator 60.

The decentralized capacitor array includes two symmetrically arranged capacitor array units, each capacitor array unit includes a first sub-capacitor array 10 of a high segment bit and a second sub-capacitor array 20 of a low segment bit.

The first sub-capacitor array 10 includes first capacitor units 11 sequentially connected in parallel and first switches 12, each first capacitor unit 11 is connected to the data weighted average module 40 and the mismatch error shaping module 50 through one of the first switches 12, and capacitance of each first capacitor unit 11 is equal.

The second sub-capacitor array 20 includes second capacitor units 21 and second switches 22, the second capacitor units 21 are set in sequence from low bit to high bit in a binary weighted manner by capacitance, and each second capacitor unit 21 is connected to the mismatch error shaping module 50 through one of the second switches 22.

A signal terminal of the control logic generation circuit 30 is connected to a signal input of the data weighted average module 40 and a signal input of the mismatch error shaping module 50, and the control logic generation circuit 30 is configured to output a high-bit binary code to the data weighted average module 40 and output a low-bit binary code to the mismatch error shaping module 50.

The mismatch error shaping module 50 is configured to control over-sampling conversion of the decentralized capacitor array, and control a lower plate of each first capacitor unit 11 and a lower plate of each second capacitor unit 21 to reset alternately in sequence after each conversion, where reset of each first capacitor unit 11 occurs before sampling, and reset of each second capacitor unit 12 occurs after sampling, so that an error introduced by each second capacitor unit 12 in last conversion is subtracted from sampled signal.

The data weighted average module 40 is configured to convert the high-bit binary code into a thermometer code to adapt to the first sub-capacitor array 10, record a last first capacitor unit 11 encoded as X participating in current conversion, and take a first capacitor unit 11 encoded as X+1 as an initial capacitor unit to start conversion at beginning of next conversion.

The digital filter and the decimator are configured to average signal converted by the analog-to-digital converter for multiple times and output.

In this embodiment, the decentralized capacitor array includes two symmetrically arranged capacitor array units with a differential structure, as listed in FIG. 2. The decentralized capacitor array is configured to receive differential signal. The first capacitor array is set to a high bit. The first sub-capacitor array 10 is provided, the capacitance of each first capacitor unit 11 is set to be equal, numbers of the first capacitor units 11 and the first switches 12 are both $2^k-1$, where k is greater than 1. The data weighted average module 40 is configured to convert the received binary code into a thermometer code, and the switching of the first switch 12 is controlled, so that no matter which bit the thermometer code jumps, it will not cause a large number of first capacitor units 11 to switch together, so that it will not cause a large conversion error. The capacitances of the second capacitor units 21 are set in a binary weighted manner, which avoids a large number of parallel branches caused by the use of the first sub-capacitor array 10, thereby reducing the conversion error of the capacitor array and improving the conversion accuracy of the analog-to-digital converter.

At the same time, in order to further reduce the interference of noise on the operation of the capacitor array, the second sub-capacitor array 20 is set as a low-bit capacitor array, and the first sub-capacitor array 10 is set as a high-bit capacitor array. So that for the first sub-capacitor array 10, when the thermometer code jumps, only the switching of one first capacitor unit 11 will be affected. So, the first sub-capacitor array 10 is set in the high bit to reduce the interference of noise on capacitance jumps by reducing the number of capacitance switches. Further, since the first sub-capacitor array 10 and the second sub-capacitor array 20 are adjacent, the capacitance of the first capacitor unit 11 with the lowest bit is twice the maximum capacitance of the second capacitor units 21. In this embodiment, the type of the capacitor array is not limited, and it may be a 12 bits DAC capacitor array or any bit DAC capacitor array, which may be selected according to an actual situation.

At the same time, the capacitance of the first capacitor unit 11 can be set correspondingly, it can be set to 2 times unit capacitance, 4 times unit capacitance, 8 times unit capacitance, etc. according to the actual situation. When the capacitance of the first capacitor unit 11 is 2 times unit capacitance, the second capacitor unit 21 includes 1 times unit capacitance and a LSB capacitor array with k bits binary weight (k>1) connected to the 1 times capacitor unit via a bridge capacitor. The structure of the LSB capacitor array with k bits binary weight is the same as that of the conventional LSB capacitor array structure, which is not detailed here. When the first capacitor unit 11 is 4 times unit capacitance, the second capacitor unit 21 includes a 2 times unit capacitance and a 1 times unit capacitance connected in parallel, and a LSB capacitor array with k bits binary weight connected to the 1 times capacitor unit via a bridge capacitor, and so on.

In this embodiment, the data weighted average module 40 converts the binary code output by the control logic generation circuit 30 into a thermometer code to adapt to the corresponding decentralized capacitor array. The first capacitor units 11 are numbered sequentially, and a number of the last separation capacitor used in current conversion is recorded as X and saved. When the next conversion starts, the first capacitor unit 11 encoded as X+1 is taken as the initial separation capacitor, so as to control each first capacitor unit 11 in the capacitor array participate the same or similar number of times of conversion in multiple conversions, so as to eliminate the correlation between the first sub-capacitor array 10 and the input signal. After the conversion, the digital filter and the decimator are configured for averaging for more than $2^m$ times and outputting, where m is greater than or equal to 1. Since the errors themselves are relative to $2^m$ times the error between unit capacitances, the sum of the errors is equal to zero, so the average error is reduced by about $2^m$ times.

At the same time, for the second sub-capacitor array 20, it is assumed that the first sub-capacitor array 10 is ideal, only considering the error introduced by nonlinearity of the second sub-capacitor array 20. After each conversion, the lower plate of the first capacitor unit 11 and the lower plate of the second capacitor unit 21 are controlled to reset alternately in sequence, where the reset of the first capacitor unit 11 occurs before sampling, and the reset of the second capacitor unit 21 occurs after sampling. That is, after the first conversion, Dout (0)=Vin (0)+El (0), where El (0) is error introduced by first conversion of the second sub-capacitor array; after the second conversion, Dout (1)=Vin (1)+El (1)–El (0); after multiple conversions, the sampled signal subtracts the error introduced by the second capacitor unit in the previous conversion, and so on, after N conversions, the output of the analog-to-digital converter is Dout (N)=Vin (N)+El (N)–El (N–1). Similarly, after the digital filter and the decimator take the average of $2^m$ times, the error is also reduced by about $2^m$ times.

Figure 3:
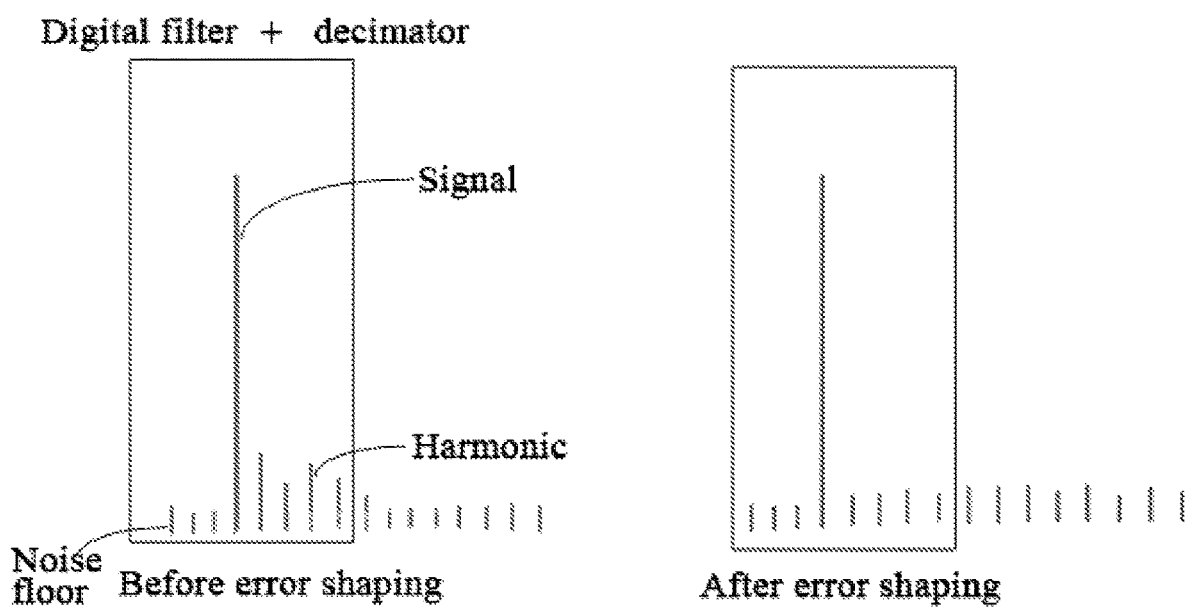
FIG. 3 is a schematic diagram showing frequency domain waveform before and after shaping of the analog-to-digital converter error shaping circuit of this application.

Therefore, without increasing the area, combined with oversampling, the data weighted average module 40 and the mismatch error shaping module 50 scatter the harmonic energy caused by nonlinearity of the analog-to-digital converter to the noise floor. As shown in FIG. 3, in the lower half of FIG. 3, the energy of harmonics in the frequency domain is reduced, the noise floor is raised, and the total noise energy is almost unchanged. In essence, the total noise energy including harmonics will not be reduced. The digital low-pass filtering and decimation are carried out through the digital filter and the decimator to eliminate harmonics, improve the signal-to-noise ratio, and break the limitation of capacitor array to high-precision analog-to-digital converters.

According to the technical solution of this application, a decentralized capacitor array, a data weighted average module 40, a mismatch error shaping module 50, a control logic generation circuit 30, a digital filter and a decimator are used to form an analog-to-digital converter error shaping circuit. The decentralized capacitor array includes two symmetrically arranged capacitor array units, each capacitor array unit includes a first sub-capacitor array 10 of a high segment bit and a second sub-capacitor array 20 of a low segment bit. The first sub-capacitor array 10 includes first capacitor units 11 sequentially connected in parallel and first switches 12, each first capacitor unit 11 is connected to the data weighted average module 40 and the mismatch error shaping module 50 through one of the first switches 12, and capacitance of each first capacitor unit 11 is equal. The second sub-capacitor array 20 includes second capacitor units 21 and second switches 22, the second capacitor units 21 are set in sequence from low bit to high bit in a binary weighted manner by capacitance, and each second capacitor unit 21 is connected to the mismatch error shaping module 50 through one of the second switches 22.

The data weighted average module 40 is configured to convert the binary code output by the control logic generation circuit 30 into a thermometer code and output it to the first sub-capacitor array 10, at the same time control each first capacitor unit 11 to participate in the conversion equal or similar times, and eliminate the correlation between the first sub-capacitor array 10 and the input signal. At the same time, the mismatch error shaping module 50 controls the first capacitor units 11 and the second capacitor units 21 to reset alternately after each conversion, while the other keeps the switching state where the conversion is completed, so as to eliminate the correlation between the second sub-capacitor array 20 and the input signal. So that the harmonic energy caused by the nonlinearity of the capacitor array is scattered to the noise floor, the average output is taken in combination with the digital filter and the decimator, and the harmonics are filtered out to improve the signal-to-noise ratio, so as to reduce the error of the capacitor array and improve the linearity of the DAC capacitor array without increasing the area of the capacitor array, thereby breaking the limitation of capacitor array to high precision analog-to-digital converter ADC.

This application further provides a successive approximation analog-to-digital converter, which includes a comparator, a register connected to an output of the comparator and an analog-to-digital converter error shaping circuit. The specific structure of the analog-to-digital converter error shaping circuit refers to the above embodiment, since the successive approximation analog-to-digital converter adopts all the technical solutions of all the above embodiments, it has at least all the beneficial effects brought by the technical solutions of the above embodiments, which will not be described herein.

This embodiment gives a general working process of the successive approximation analog-to-digital converter: first, the analog input signal is sampled and held, and sent to one end of the comparator, then the control logic generation circuit 30 presets the highest bit of the register to 1, and all other bits are cleared. The analog-to-digital converter outputs ½ of the reference voltage under control of the reference voltage and the register to the other end of the comparator. If the analog input signal voltage is greater than ½ of the reference voltage, then the comparator outputs 1, and the highest bit of the register is set to 1. Otherwise, if the analog input signal voltage is less than ½ of the reference voltage, the comparator outputs 0, the highest bit of the register is set to 0. In this way, the highest bit of the successive approximation analog-to-digital converter is determined. Then the second highest bit is determined, that is, the second highest bit of the register is preset to 1, if the highest significant bit determined in the previous conversion period is 1, the analog-to-digital converter outputs ¾ of the reference voltage, and the analog input signal voltage is compared with the ¾ of the reference voltage to determine the second highest bit of the register. If the highest significant bit determined in the previous conversion period is 0, the analog-to-digital converter outputs ¼ of the reference voltage at this time, the analog input signal voltage is compared with the ¼ of the reference voltage to determine the second highest bit of the register. And so on, until the lowest bit of the register is determined, so that the value of the register is the final output of the successive approximation analog-to-digital converter.

The above are only optional embodiments of this application, and thus does not limit the scope of this application, and the equivalent structural transformation made by the content of the specification and the drawings of this application, or directly/indirectly applied to other related technical fields are all included in the scope of this application.

What is claimed is:

1. An analog-to-digital converter error shaping circuit, comprising a decentralized capacitor array, a data weighted average module, a mismatch error shaping module, a control logic generation circuit, a digital filter and a decimator; wherein:
   the decentralized capacitor array comprises two symmetrically arranged capacitor array units, each capacitor array unit comprises a first sub-capacitor array of a high segment bit and a second sub-capacitor array of a low segment bit;
   the first sub-capacitor array comprises first capacitor units sequentially connected in parallel and first switches, each first capacitor unit is connected to the data weighted average module and the mismatch error shaping module through one of the first switches, and capacitance of each first capacitor unit is equal;
   the second sub-capacitor array comprises second capacitor units and second switches, the second capacitor units are set in sequence from low bit to high bit in a binary weighted manner by capacitance, and each second capacitor unit is connected to the mismatch error shaping module through one of the second switches;
   a signal terminal of the control logic generation circuit is connected to a signal input of the data weighted average module and a signal input of the mismatch error shaping module, and the control logic generation circuit is configured to output a high-bit binary code to the data weighted average module and output a low-bit binary code to the mismatch error shaping module;
   the mismatch error shaping module is configured to control over-sampling conversion of the decentralized capacitor array, and control a lower plate of each first capacitor unit and a lower plate of each second capacitor unit to reset alternately in sequence after each conversion, wherein reset of each first capacitor unit is occurred before sampling, and reset of each second capacitor unit is occurred after sampling, so that an error introduced by each second capacitor unit in last conversion is subtracted from a sampled signal;
   the data weighted average module is configured to convert the high-bit binary code into a thermometer code to adapt to the first sub-capacitor array, record a last first capacitor unit encoded as X participating in current conversion, and take a first capacitor unit encoded as X+1 as an initial capacitor unit to start conversion at beginning of next conversion; and
   the digital filter and the decimator are configured to average a signal converted by the analog-to-digital converter for multiple times and output.

2. The analog-to-digital converter error shaping circuit of claim 1, wherein the first sub-capacitor array is a high-bit capacitor array, and numbers of the first capacitor units and the first switches are both $2^k-1$, where k is greater than 1; the second sub-capacitor array is a low-bit capacitor array; and a capacitance of a first capacitor unit with a lowest bit is twice a maximum capacitance of the second capacitor units, and the capacitance of each first capacitor unit is 2n times a unit capacitance, where n is greater than or equal to 1.

3. The analog-to-digital converter error shaping circuit of claim 1, wherein the digital filter and the decimator are configured to average the signal converted by the analog-to-digital converter more than $2^m$ times, where m is greater than or equal to 1.

4. The analog-to-digital converter error shaping circuit of claim 1, wherein a sum of errors introduced in analog-to-digital conversion by the first capacitor units and the second capacitor units is zero.

5. A successive approximation analog-to-digital converter, comprising a comparator, a register connected to an output of the comparator, and an analog-to-digital converter error shaping circuit, the analog-to-digital converter error shaping circuit comprising a decentralized capacitor array, a data weighted average module, a mismatch error shaping module, a control logic generation circuit, a digital filter and a decimator; wherein:

the decentralized capacitor array comprises two symmetrically arranged capacitor array units, each capacitor array unit comprises a first sub-capacitor array of a high segment bit and a second sub-capacitor array of a low segment bit;

the first sub-capacitor array comprises first capacitor units sequentially connected in parallel and first switches, each first capacitor unit is connected to the data weighted average module and the mismatch error shaping module through one of the first switches, and capacitance of each first capacitor unit is equal;

the second sub-capacitor array comprises second capacitor units and second switches, the second capacitor units are set in sequence from low bit to high bit in a binary weighted manner by capacitance, and each second capacitor unit is connected to the mismatch error shaping module through one of the second switches;

a signal terminal of the control logic generation circuit is connected to a signal input of the data weighted average module and a signal input of the mismatch error shaping module, and the control logic generation circuit is configured to output a high-bit binary code to the data weighted average module and output a low-bit binary code to the mismatch error shaping module;

the mismatch error shaping module is configured to control over-sampling conversion of the decentralized capacitor array, and control a lower plate of each first capacitor unit and a lower plate of each second capacitor unit to reset alternately in sequence after each conversion, where reset of each first capacitor unit is occurred before sampling, and reset of each second capacitor unit is occurred after sampling, so that an error introduced by each second capacitor unit in last conversion is subtracted from a sampled signal;

the data weighted average module is configured to convert the high-bit binary code into a thermometer code to adapt to the first sub-capacitor array, record a last first capacitor unit encoded as X participating in current conversion, and take a first capacitor unit encoded as X+1 as an initial capacitor unit to start conversion at beginning of next conversion; and the digital filter and the decimator are configured to average a signal converted by the analog-to-digital converter for multiple times and output.

6. The successive approximation analog-to-digital converter of claim 5, wherein the first sub-capacitor array is a high-bit capacitor array, and numbers of the first capacitor units and the first switches are both $2^k-1$, where k is greater than 1; the second sub-capacitor array is a low-bit capacitor array; and a capacitance of a first capacitor unit with a lowest bit is twice a maximum capacitance of the second capacitor units, and the capacitance of each first capacitor unit is 2n times a unit capacitance, where n is greater than or equal to 1.

7. The successive approximation analog-to-digital converter of claim 5, wherein the digital filter and the decimator are configured to average the signal converted by the analog-to-digital converter more than $2^m$ times, where m is greater than or equal to 1.

8. The successive approximation analog-to-digital converter of claim 5, wherein a sum of errors introduced in analog-to-digital conversion by the first capacitor units and the second capacitor units is zero.

* * * * *